(12) United States Patent
Chou et al.

(10) Patent No.: US 7,746,146 B2
(45) Date of Patent: Jun. 29, 2010

(54) JUNCTION FIELD EFFECT TRANSISTOR INPUT BUFFER LEVEL SHIFTING CIRCUIT

(75) Inventors: Richard K. Chou, Palo Alto, CA (US); Damodar R. Thummalapally, Milpitas, CA (US)

(73) Assignee: SuVolta, Inc., Los Gatos, CA (US)

( * ) Notice: Subject to any disclaimer, the term of this patent is extended or adjusted under 35 U.S.C. 154(b) by 113 days.

(21) Appl. No.: 11/515,252

(22) Filed: Sep. 1, 2006

(65) Prior Publication Data
US 2008/0042723 A1 Feb. 21, 2008

(51) Int. Cl.
*H03L 5/00* (2006.01)
(52) U.S. Cl. .................................. 327/333; 326/80
(58) Field of Classification Search .............. 327/306, 327/333; 326/62–63, 80–81
See application file for complete search history.

(56) References Cited

U.S. PATENT DOCUMENTS 5,834,962 A * 11/1998 Okamoto ................ 327/333
5,973,534 A * 10/1999 Singh ..................... 327/309
6,137,339 A * 10/2000 Kibar et al. ............. 327/333
6,400,206 B2 * 6/2002 Kim et al. ............... 327/333
6,809,554 B2 * 10/2004 Wada ...................... 326/81
7,091,748 B2 * 8/2006 Wada ...................... 326/81
7,167,036 B2 * 1/2007 Fournel .................. 327/333

FOREIGN PATENT DOCUMENTS

EP 0222467 A1 5/1985

OTHER PUBLICATIONS

U.S. Appl. No. 11/495,099, Not Published, Chou et al.
U.S. Appl. No. 11/495,908, Not Published, Chou et al.
PCT International Search Report for International Application No. PCT/US2007/077190 of Dec. 20, 2007.

* cited by examiner

*Primary Examiner*—Dinh T. Le
(74) *Attorney, Agent, or Firm*—Darryl G. Walker

(57) ABSTRACT

A level shifting circuit can include a first input junction field effect transistor (JFET) having a gate coupled to receive an input signal having a first voltage swing that provides a controllable impedance path between a first supply node and a first terminal of a first bias stack including at least one JFET. A driver circuit can be coupled to receive an output from the first bias stack that provides a level shifted output having a second voltage swing that is less than the first voltage swing.

13 Claims, 4 Drawing Sheets

JUNCTION FIELD EFFECT TRANSISTOR INPUT BUFFER LEVEL SHIFTING CIRCUIT

This application claims the benefit of U.S. patent application Ser. No. 11/495,099 filed on Jul. 28, 2006 and U.S. patent application Ser. No. 11/495,908 filed on Jul. 28, 2006. The contents of both of these applications are incorporated by reference herein.

TECHNICAL FIELD

The present invention relates generally to level shifting circuits, and more particularly to level shifting circuits that include junction field effect transistors (JFETs).

BACKGROUND OF THE INVENTION

Level shifting circuits can translate an input signal that varies within one voltage range, to an output signal that varies within another, different voltage range. Typically, level shifting circuits can be utilized to translate between logic signals operating at different signal voltage levels (e.g., TTL to CMOS). Level shifting circuits for metal-oxide-semiconductor (MOS) type technologies, particularly CMOS type technology are well known.

Co-pending U.S. patent application Ser. No. 11/452,442 filed on Jun. 13, 2006 and U.S. Provisional Patent Application Ser. No. 60/799,787 filed on May 11, 2006, both by Ashok K. Kapoor, show examples of novel circuits that include junction field effect transistors (JFETs) that operate at relatively low voltage levels (e.g., 0 to +0.5 volts). Such circuits can form integrated circuits that include few, or preferably no MOS type transistors. JFET transistors may have manufacturing advantages over MOSFETs due to the lack of a thin gate oxide layer. Accordingly, CMOS type level shifting circuits are of no benefit in shifting voltage levels of signals in a device that includes only JFET technology.

Co-pending U.S. patent application Ser. No. 11/495,099 filed on Jul. 28, 2006 and U.S. Provisional Patent Application Ser. No. 11/495,908 filed on Jul. 28, 2006, both by the present applicants, show examples of novel level shift circuits that include junction field effect transistors (JFETs). U.S. patent application Ser. No. 11/495,099 shows level shift circuits having complementary JFETs that may shift from a relatively low voltage level (e.g., 0 to +0.5 volts) to a relatively high voltage level (e.g., 0 to +2.5 volts).

DETAILED DESCRIPTION OF THE EMBODIMENTS

Various embodiments of the present invention will now be described in detail with reference to a number of drawings. The embodiments show level shifting circuits and methods constructed with junction field effect transistors (JFETs), for example four terminal JFETs of complementary conductivity types (n-channel and p-channel types or PJFETs and NJFETs). Four terminal JFETs can include two control terminals on different sides of a channel region.

The disclosed embodiments are in contrast to conventional level shifting circuits formed from complementary metal-oxide-semiconductor (CMOS) type technologies, constructed with MOS type transistors.

Figure 1:
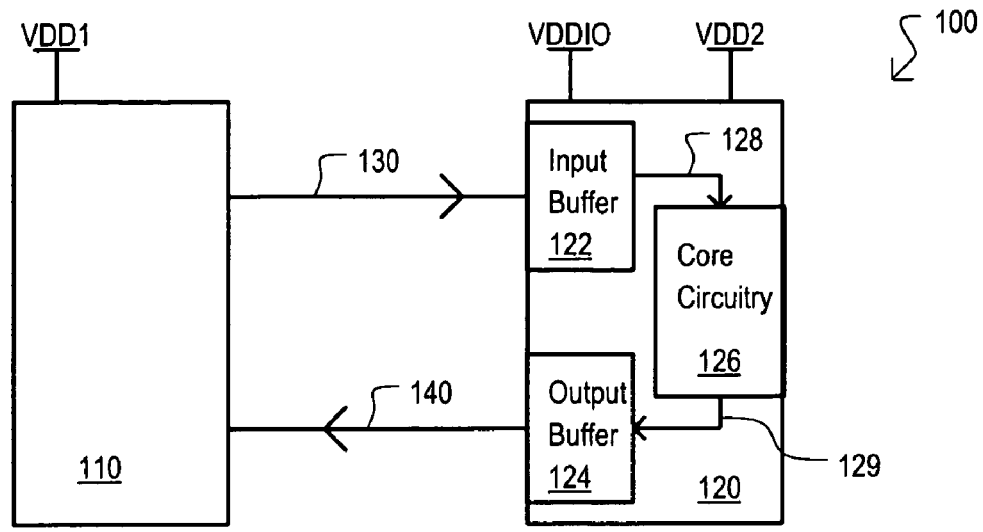
FIG. 1 is a block schematic diagram of a system including devices having differing operating voltages according to an embodiment.

Referring now to FIG. 1, a block schematic diagram of a system including devices having differing operating voltages according to an embodiment is set forth in a block schematic diagram and given the general reference character 100. System 100 may include a first semiconductor device 110 and a second semiconductor device 120. The first semiconductor device 110 may operate at a first supply voltage VDD1. The second semiconductor device 120 may operate at a second supply voltage VDD2, lower than the first supply voltage VDD1. Semiconductor devices 110 and 120 may communicate between each other via first and second buses 130 and 140. Bus 130 may be a bus that provides a communication path from first semiconductor device 110 to second semiconductor device 120. Bus 140 may be a bus that provides a communication path from second semiconductor device 120 to first semiconductor device 110. Although, buses 130 and 140 are illustrated as single direction buses, they may be bidirectional buses, as just one more example.

Buses 130 and 140 may operate at voltage level VDDIO that is higher than the second supply voltage VDD2. As just one example, VDD1 may be about 1.8 Volts, VDDIO may be about 1.8 Volts, and VDD2 may be about 0.5 Volts.

Second semiconductor device 120 may include an input buffer circuit 122 and an output buffer circuit 124 as well as core logic circuitry 126.

Input buffer 122 may receive an input signal from bus 130 and may provide a voltage conversion from a first voltage level to a second voltage level (e.g., convert a voltage swing). The first voltage level may be the voltage level VDDIO and the second voltage level may be the second voltage supply VDD2. Core logic circuitry 126 may receive the input signal after the voltage conversion (signal 128). Core logic circuitry 126 may be complementary JFET circuitry operating at the second voltage supply VDD2. Complementary JFET circuitry includes p-channel JFETs (PJFETs) and n-channel JFETs (NJFETs). The JFET circuitry may have inherent pn junctions that can become forward biased it the second voltage supply VDD2 is too high. For this reason, a second voltage supply VDD2 can be maintained below the forward bias voltage (i.e., about 0.6 V) of these pn junctions.

Output buffer 124 may receive a signal 129 from core logic circuitry 126 and may provide a voltage conversion from the second voltage level to the first voltage level to provide an output signal on bus 140. The output signal on bus 140 may have the voltage level VDDIO (e.g., a voltage that can swing from essentially 0 to VDDIO).

First semiconductor device 110 may be a CMOS based device, bipolar based device, or any semiconductor device that operates at a higher operating voltage than second semiconductor device 120, and/or generates output signals having higher peak voltage levels than second semiconductor device 120.

Figure 2:
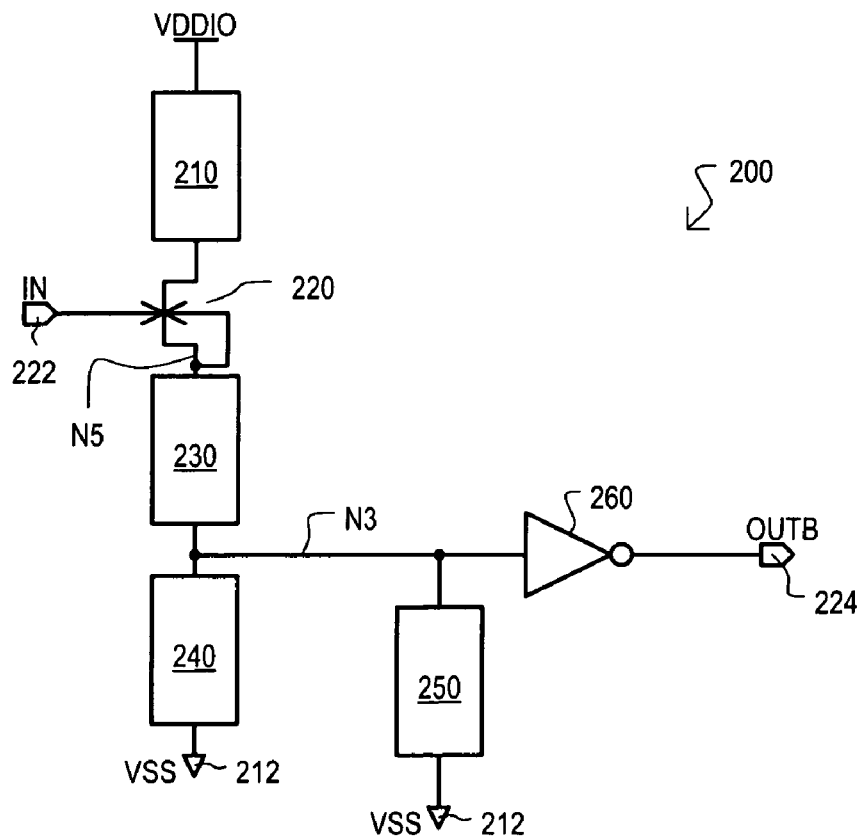
FIG. 2 is a circuit schematic diagram of an input buffer circuit according to an embodiment.

Referring now to FIG. 2, a circuit schematic diagram of an input buffer circuit according to an embodiment is set forth and given the general reference character 200. Input buffer circuit 200 may be used as input buffer 122 of FIG. 1, as just one example.

Input buffer circuit 200 may receive an input signal IN at an input terminal 222 and may provide an output signal OUTB at an output terminal 224. Input signal IN and output signal OUTB can have an inverse relationship with one another. That is, when input signal IN transitions from low-to-high, output signal OUTB can transition from high-to-low, and vice versa. Input signal IN may have a first voltage swing and output signal OUTB may have a second voltage swing smaller than the first voltage swing. In the particular example shown, input signal IN can swing between a low power supply voltage VSS and a power supply voltage VDDIO. Output signal OUTB may swing between a low power supply voltage VSS and a power supply voltage VDD2. In one particular example, input signal IN may have essentially a 1.8 V swing and output signal OUTB may have essentially a 0.5 V swing.

Unlike conventional input buffer circuits, an input buffer 200 can incorporate one or more JFETs, preferably a four terminal JFET as the active device for driving signals between the two swings.

Referring still to FIG. 2, an input buffer 200 may include a first bias stack 210, an input section 220, a second bias stack 230, a third bias stack 240, a shaping circuit 250, and an inverting buffer 260.

The first bias stack 210 can be connected between the high power supply VDDIO and the input section 220. The input section 220 can receive the input signal IN and provide a controllable impedance path between the first bias stack 210 and the second bias stack 230. The second bias stack 230 can be connected between the input section 220 and an input of inverting buffer 260. The third bias stack 240 can be connected between the input of inverting buffer 260 and a lower power supply voltage 212. The shaping circuit 250 can be connected between the input of inverting buffer 260 and a lower power supply voltage 212. The inverting buffer 260 can provide an output signal OUTB as an output.

The first bias stack 210 can be used to adjust the trip point with respect to input signal IN in which buffer circuit 200 can switch the output signal OUTB from a first state to a second state. Input section 220 can receive an input signal and provide either a low impedance path or a high impedance path between the first and second bias stacks (210 and 230). Second bias stack 230 and third bias stack 240 may operate to prevent forward bias of an inherent pn junction within input section 220 and provide a proper bias trigger point at a node N3 at the input of inverting buffer 260. Shaping circuit 250 may improve the voltage swing at node N3 and may particularly improve the low portion of the voltage swing of node N3.

Input buffer circuit 200 may be an inverting input buffer, such that the input signal IN and output signal OUT may have the complementary logic levels, however, it is understood that by providing a non-inverting buffer instead of a inverting buffer 260, input buffer circuit 200 may become an non-inverting input buffer circuit to provide an output signal OUTB that is non-complementary to input signal IN.

Figure 3:
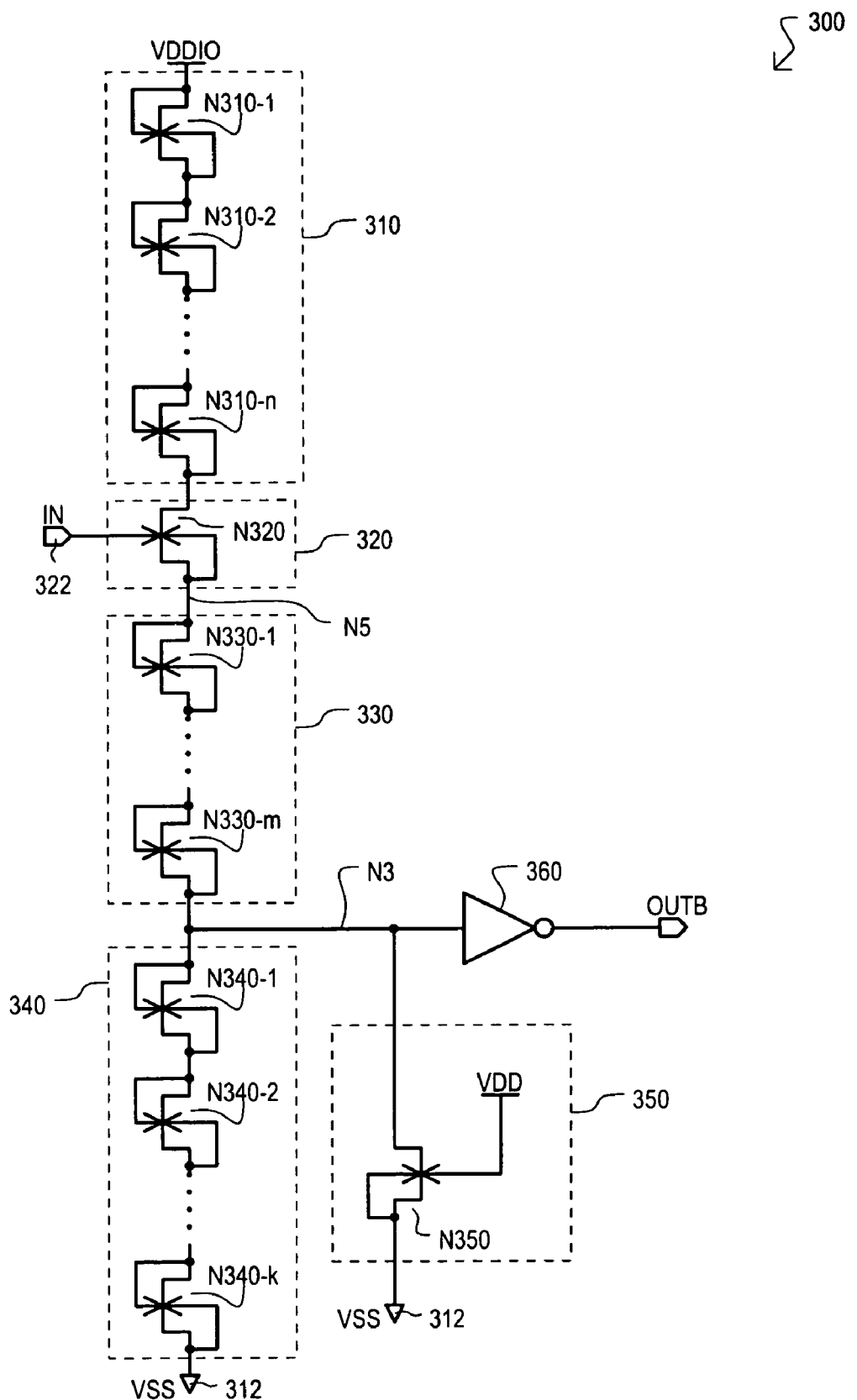
FIG. 3 is a circuit schematic diagram of an input buffer circuit that can be formed from four terminal enhancement mode JFET devices according to an embodiment.

Referring now to FIG. 3, a circuit schematic diagram of an input buffer circuit that can be formed from four terminal enhancement mode JFET devices according to an embodiment is set forth and given the general reference character 300. Input buffer circuit 300 may be used as input buffer 122 of FIG. 1, as just one example. Input buffer circuit may include similar constituents as input buffer circuit 200, such constituents may have the same reference character except the first number can be a "3" instead of a "2".

Input buffer circuit 300 may include a first bias stack 310, an input section 320, a second bias stack 330, a third bias stack 340, a shaping circuit 350, and an inverting buffer 360.

The first bias stack 310 may include a number of n-channel JFETs (NJFETs) N310-1 to N310-$n$ arranged in series with one another between power supply voltage VDDIO and the drain of NJFET N320 within input section 320. In the particular example shown, each NJFET can have a first gate connected to its drain and a second gate connected to its source. In such an arrangement, each NJFET can introduce at least a threshold voltage $V_T$ drop between the power supply VDDIO and a drain of an NJFET N320 in input section 320, where $V_T$ is a threshold voltage of a particular NJFET. The threshold voltage may be about 0.1-0.3 Volts, for example, and should not exceed 0.6 Volts. As a result, the drain of NJFET N320 may be clamped to no greater than power supply voltage VDDIO minus n*$V_T$ (where n is the number of NJFETs within the bias stack). The first bias stack 310 may be used to select a threshold voltage of the input buffer circuit 300. For a higher threshold voltage fewer NJFETs (n may be smaller) may be included and for a lower threshold voltage more NJFETs (n may be larger) may be included.

Input section 320 can include NJFET N320. NJFET N320 can have a drain connected to the source of NJFET N310-$n$ of first bias stack 310 and a source connected to a drain of an NJFET N330-1 of second bias stack 330. NJFET N320 may receive input signal IN at a first gate and may have a second gate connected to its source. NJFET N320 can provide a controllable impedance path between the source of NJFET N310-$n$ and the drain of NJFET N330-1. When input signal IN is at a high logic level, NJFET 320 may provide a low impedance path and when input signal IN is at a low logic level, NJFET 320 may provide a high impedance path.

The second bias stack 330 can include a number (m) of NJFETs N330-1 to N330-$m$ arranged in series with one another between the drain of NJFET N320 and an input of buffer 360. In the particular example shown, each NJFET can have a first gate connected to its drain and a second gate connected to its source. In such an arrangement, each NJFET can introduce at least a threshold voltage $V_T$ drop between the source of an NJFET N320 and input of buffer 360, where $V_T$ is a threshold voltage of a particular NJFET. The threshold voltage may be about 0.1-0.3V, for example.

The third bias stack 340 may include can include a number (k) of NJFETs N340-1 to N330-$k$ arranged in series with one another between input of buffer 360 and a reference voltage 312. In the particular example shown, each NJFET can have a first gate connected to its drain and a second gate connected to its source. In such an arrangement, each NJFET can introduce at least a threshold voltage $V_T$ drop between the input of buffer 360 and reference voltage 312, where $V_T$ is a threshold voltage of a particular NJFET. The threshold voltage may be about 0.1-0.3V, for example.

Second bias stack 330 and third bias stack 340 may ensure that the pn junction formed from gate to source of NJFET N320 does not become forward biased. When the logic high voltage of input signal IN is greater, m and/or k may become larger. When the logic high voltage of input signal IN is smaller, m and/or k may become smaller.

Shaping circuit 350 may include a NJFET N350 having a drain connected to an input of buffer 360 and a source connected to reference voltage 312. NJFET N350 may have a first gate connected to a power supply VDD and a second gate connected to its source. Shaping circuit 350 may be a relatively weak device and may improve the voltage swing at the input of inverting buffer 360 and may particularly ensure a low level at the input of inverting buffer 360 can reach essentially the reference voltage 312.

Reference voltage 312 may be a ground or Vss.

Inverting buffer 360 can provide an output signal OUTB. Buffer 360 may include a strong PJFET and a weak NJFET to allow a higher trip point than Vcc/2 to compensate for a slower pull down of the input of inverting buffer 360.

Each NJFET in input buffer 300 may be an "enhancement" mode JFET as described in U.S. patent application Ser. No. 11/452,442 and U.S. Provisional Patent Application Ser. No. 60/799,787, referred to and incorporated by reference above.

The operation of input buffer 300 will now be described by referring to the waveform diagram of FIG. 4 in conjunction with FIG. 3.

Figure 4:
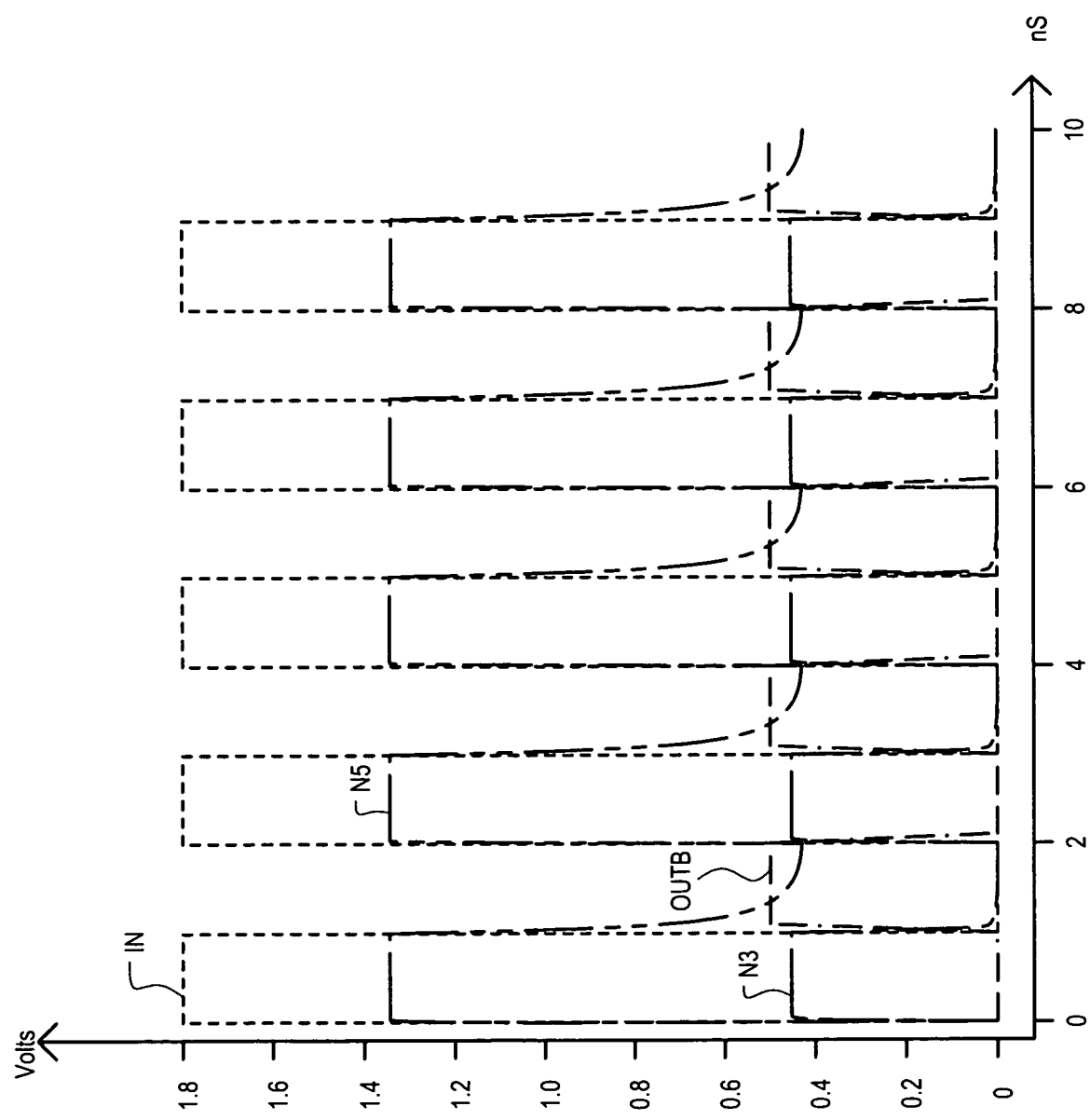
FIG. 4 is a waveform diagram illustrating the operation of an input buffer according to an embodiment.

FIG. 4 is a waveform diagram illustrating the operation of input buffer 300 according to an embodiment. FIG. 4 is a waveform diagram for an input buffer when VDDIO=1.8V, VDD=0.5V, n=3, m=2, and k=3.

The waveform diagram of FIG. 4 includes the input signal IN, the output signal OUTB, node N5 (at the source of NJFET N320), and node N3 (at the input of inverting buffer 360). Input signal transitions between a first voltage swing (about 1.8V) and output signal OUTB operates at a second voltage swing (about 0.5V).

When input signal IN is at a logic low level (e.g., 0 V), output signal OUTB is at a logic high level (e.g., 0.5V), node N3 is about 0V, and node N5 is at less than or equal to $2*V_T$ (where $V_T$ is the threshold voltage of NJFET N330-1 and N330-$m$). When input signal IN transitions from a logic low to a logic high (e.g. 1.8V), NJFET N320 will start to turn on when input signal IN reaches about $1.35V+V_T$ (where $V_T$ is the threshold voltage of NJFET N320). As input signal IN continues to increase, NJFET N320 turns on harder and nodes N3 and N5 continue to rise. Once node N3 reaches a threshold voltage of inverting buffer N360, output signal OUTB starts transitioning from a logic high (e.g., 0.5V) to a logic low (e.g., 0V).

When input signal IN is at a logic high level (e.g., 1.8 V), output signal OUTB is at a logic low level (e.g., 0V), node N3 is at about 425 mV, and node N5 is at about 1.35V. When input signal IN transitions from a logic high level to a logic low level (e.g., 0V), NJFET N320 will begin to turn off and nodes N3 and N5 will begin to transition low. As input signal IN continues to decrease, NJFET N320 turns off and nodes N3 and N5 continue to fall. NJFET N320 can turn off when the input signal IN transitions to a voltage level that is less than node N5 plus $V_T$, where $V_T$ is the threshold voltage of NJFET N320. Once node N3 reaches a threshold voltage of inverting buffer N360, output signal OUTB starts transitioning from a logic low level (e.g., 0V) to a logic high level (e.g., 0.5V). With NJFET N320 turned off, node N3 can continue to be pulled toward reference voltage 312 (0V), through transistor N350 forming shaping circuit 350.

As shown in FIG. 4, input buffer 300 can receive an input signal having a first voltage swing and provide an output signal at a second voltage swing, lower than the first voltage swing. In this way, a semiconductor device 110 that operates at a first power supply level VDD1 can communicate via bus 130 with a semiconductor device 120 that operates at a second power supply level VDD2. In the particular example of FIG. 1, semiconductor device 110 can drive a signal onto bus 130 at a first voltage swing (e.g., 1.8V) and input buffer 122 can convert the input signal into a buffered input signal (signal 128) operating at a second voltage swing (e.g., 0.5V) to form an input signal to core logic circuitry 126 that operates at the second power supply level VDD2 (e.g., 0.5V).

Figure 5:
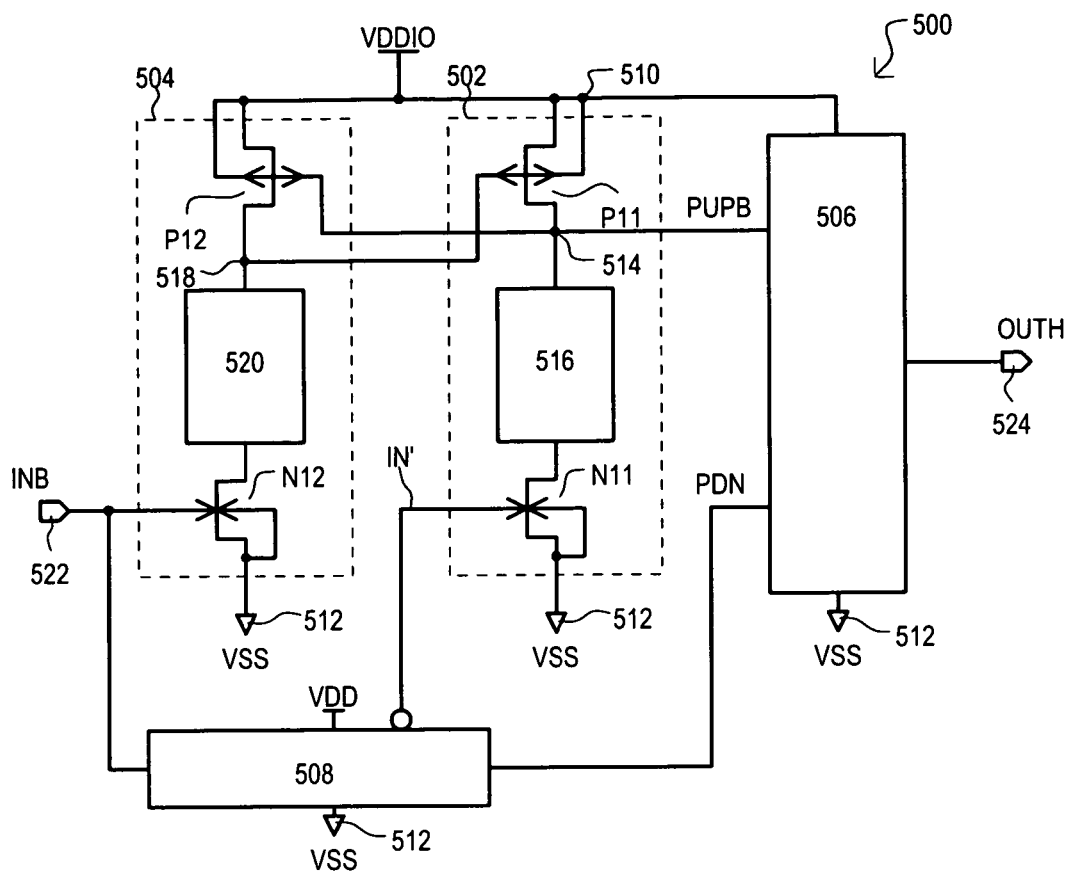
FIG. 5 is a level shifting circuit that can be used as an output buffer according to an embodiment.

Referring now to FIG. 5, a level shifting circuit according to an embodiment is shown in block schematic diagram, and designated by the general reference character 500. A level shifting circuit 500 can receive an input signal INB having a first voltage swing, and generate an output signal OUTH having a second voltage swing, greater than the first voltage level. The level shifting circuit 500 has been disclosed in U.S. patent application Ser. No. 11/495,099 referred to and incorporated above.

In the particular example of FIG. 5, input signal INB and output signal OUTH can have an inverse relationship with one another. That is, when input signal INB transitions from low-to-high, output signal OUTH can transition from high-to-low, and vice versa. In addition, in the example shown, input signal INB can swing between a low power supply voltage VSS, and a high power supply voltage VDD. At the same time, output signal OUTH can swing between the low power supply voltage VSS and a high power supply voltage VDDIO that is greater than power supply voltage VDD. Power supply VDDIO can be a supply voltage at which an external bus, such as buses 130 and 140 of FIG. 1 operate.

In the embodiment of FIG. 5, level shifting circuit 500 can include a first control section 502, a second control section 504, a driver section 506, and a low voltage control section 508. A first control section 502 can control the activation of a driver control signal PUPB at a first node 514. More particularly, first control section 502 can pull first node 514 low in response to an input signal INB being low. In the particular example of FIG. 5, a first control section 502 can include a first control n-channel JFET (NJFET) N11, a first bias stack circuit 516, and a first disable p-channel JFET (PJFET) P11. Transistor N11 can have a source connected a low power supply node 512 and a first gate coupled to an inverting output of low voltage control circuit 508. Transistor P12 can have a source connected to boosted power supply node 510, a gate connected to a disable node 518, and a drain connected to a first driver control node 514. A bias stack circuit 516 can be connected between first driver control node 514 and a drain of transistor N11.

A first bias stack circuit 516 can prevent the potential between first driver control node 514 and a drain of transistor N11 from falling below a predetermined voltage. This can enable first driver control node 514 to be driven at boosted voltage levels. In the particular example shown, when transistor N11 is enabled (has a low impedance), first bias stack circuit 516 can maintain first driver control node 514 above a source-gate forward bias voltage (e.g., about 0.6 to 0.7 volts) with respect to high voltage level VDDIO, that is under about 0.6 volts with respect to VDDIO.

A second control section 504 can control the de-activation of a driver control signal PUPB at first driver control node 514. Second control section 504 can pull a disable node 518 low in response to an input signal INB being high. This, in turn, can result in transistor P11 being turned on, and driving signal PUPB high. In the particular example of FIG. 5, a second control section 504 can include a second control NJFET N12, a second bias stack circuit 520, and a second disable PJFET P12. Transistor N12 can have a source connected a low power supply node 512 and a first gate coupled to an input node 522. Transistor P12 can have a source connected to boosted power supply node 510, a gate connected to first driver control node 514, and a drain connected to a disable node 518. A second bias stack circuit 520 can be connected between disable node 518 and a drain of transistor N12. A second bias stack circuit 520 can operate in the same manner as first bias stack circuit 516, preventing the potential between disable node 518 and a drain of transistor N12 from falling below a predetermined voltage.

Transistors P12 and P11 can be arranged in a cross-coupled manner, with the gate of one being connected to the drain of the other. In this arrangement, when a first driving signal PUPB is active (low in this example), transistor P12 can be turned on, pulling disable control node 518 high, which turns off transistor P11, preventing current from flowing through control section 502. Transistor P12 can be turned off, preventing current from flowing through first control section 502. Conversely, when a disable node 518 is driven low, transistor P11 can be turned on, pulling first driver control node 514 high.

In this way, control sections (502 and 504) can operate according to low voltage signals (IN and IN') to drive control nodes 514 and 518 at higher boosted voltage levels. In addition, current can be conserved by preventing current from flowing through control sections (502 and 504) regardless of output driver state (i.e., driving to a boosted high or low).

Referring still to FIG. 5, a low voltage control section 508 can receive input signal INB, and in response, generate output signal IN', which can be the inverse of signal INB, and signal PDN, which can follow input signal INB. Low voltage control section 508 can operate between a power supply voltage VDD and a low voltage power supply VSS.

In this way, one driving operation (in this case a pull-down operation), can operate according to low voltage logic signals, and not include boosted voltage signals, or circuits.

A driver section 506 can drive an output node 524 between a boosted high supply level VDDH and a low power supply voltage VSS. In the arrangement shown, when first driving control signal PUPB is a predetermined potential less than a high supply voltage VDDIO, output node 524 can be driven to a high supply voltage VDDIO. When first driving control signal PUPB is not a predetermined potential less than a high supply voltage VDDIO, a driver section 506 can create a high impedance path between output node 524 and boosted high supply node 510. In this way pull-up operations to a boosted high voltage level can be controlled.

When second driving control signal PDN is a predetermined potential above a low supply voltage VSS, output node 524 can be driven to a low supply voltage VSS. However, when second driving control signal PDN is not a predetermined potential above low supply voltage VSS, a driver section 506 can create a high impedance between output node 524 and low supply node 512. In this way pull-down operations to a low voltage level can be controlled.

It is noted that in the example of FIG. 5, NJFETs (N11/N12) and PJFETs (P12/P11) are four terminal JFET devices, each having a front gate, back gate, source, and drain. In the example of FIG. 5, PJFET P12 has a front gate connected to first driver control node 514, and a back gate connected to a boosted high power supply node 510. A PJFET P11 can have a front gate connected to disable control node 518, and a back gate connected to a boosted high power supply node 510. In addition, each NFET and PFET can be an "enhancement" mode JFETs, as described in U.S. patent application Ser. No. 11/452,442 and U.S. Provisional Patent Application Ser. No. 60/799,787, referred to and incorporated by reference above.

In addition, low voltage control circuit 508 is preferably formed from JFET devices, preferably, four terminal NJFET and PJFET enhancement mode devices.

Level shifting circuit 500 may be used as output buffer 124 in FIG. 1. In this way, second semiconductor device 120, having core circuitry formed with complementary JFETs, for example, can interface with a first semiconductor device 110 having circuitry formed from MOSFETs or bipolar transistors, as just a few examples, that operates at a higher power supply voltage VDD1 than the power supply voltage VDD2 in which second semiconductor device 120 operates.

Figure 6:
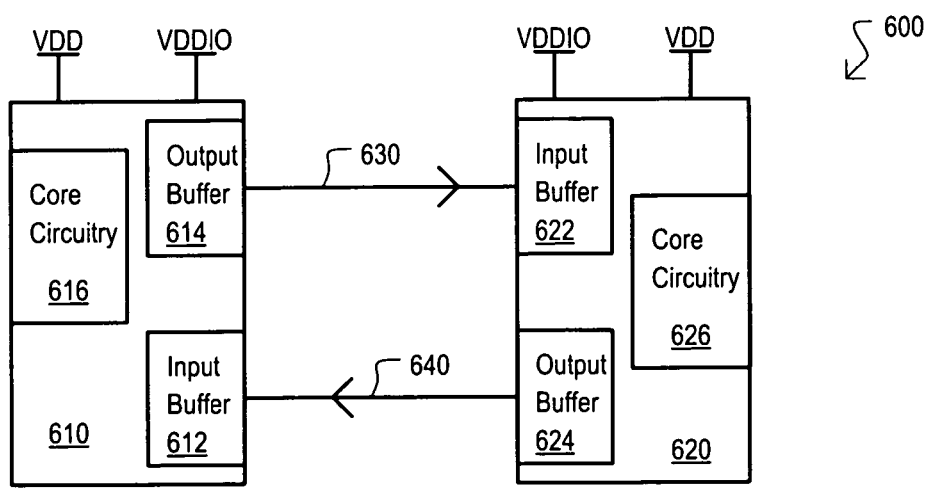
FIG. 6 a block schematic diagram of a system including JFET devices having operating voltages less than a bus operating voltage according to an embodiment.

Referring now to FIG. 6, a block schematic diagram of a system including JFET devices having operating voltages less than a bus operating voltage according to an embodiment is set forth in a block schematic diagram and given the general reference character 600. System 600 may include a first semiconductor device 610 and a second semiconductor device 620. The first and second semiconductor device 110 may operate at a supply voltage VDD. Semiconductor devices 610 and 620 may communicate between each other via first and second buses 630 and 640. Bus 630 may be a bus that provides a communication path from first semiconductor device 610 to second semiconductor device 620. Bus 640 may be a bus that provides a communication path from second semiconductor device 620 to first semiconductor device 610. Although, buses 630 and 640 are illustrated as single direction buses, they may be bidirectional buses, as just one more example.

Buses 630 and 640 may operate at voltage level VDDIO that is higher than the supply voltage VDD. As just one example, VDDIO may be about 1.8 Volts, and VDD may be about 0.5 Volts.

First semiconductor device 610 may include an input buffer circuit 612 and an output buffer circuit 614 as well as core logic circuitry 616.

Second semiconductor device 620 may include an input buffer circuit 622 and an output buffer circuit 624 as well as core logic circuitry 626.

Input buffers (612 and 622) may receive an input signal from a respective bus (640 and 630) and may provide a voltage conversion from a first voltage level to a second voltage level (e.g. voltage swing). The first voltage level may be the voltage level VDDIO and the second voltage level may be the supply voltage VDD. A respective core logic circuitry (616 and 626) may receive the input signal after the voltage conversion. Core logic circuitry (616 and 626) may be complementary JFET circuitry operating at the supply voltage VDD.

Output buffer (614 and 624) may receive a signal from a respective core logic circuitry (616 and 626) and may provide a voltage conversion from the second voltage level to the first voltage level to provide a respective output signal on a bus (630 and 640). The output signal on bus (630 and 640) may have the voltage level VDDIO (e.g. voltage swing from essentially 0 to VDDIO.

First and second semiconductor devices (610 and 620) may include JFET devices. Input buffers (612 and 622) may be an input buffer (200 and 300) of FIGS. 2 and 3, for example. Output buffers (614 and 624) may be an output buffer 500 of FIG. 5.

In this way, first and second semiconductor devices 610 and 620 including core circuitry having a first operating voltage can interface on a system bus having a voltage swing VDDIO much greater than the operating voltage VCC. This can be particularly important with semiconductor devices including complementary JFETs due to the inherent pn junctions formed from JFET devices. For example, a complementary JFET inverter can include a PJFET and an NJFET connected in series and having a common gate connection to receive the input signal. If the input signal has a voltage swing that is more than 0.6 volts above Vcc, then the gate to source junction of the PJFET can become forward biased. By including a step-down buffer, such forward biasing may be eliminated.

Although the embodiments illustrate an input buffer circuit 200 and 300 that is used as an input buffer for a semiconductor device, input buffer circuit (200 and 300) can be a voltage translator to interface between higher voltage operating circuitry and JFET circuitry on the same semiconductor device, for example. Likewise, output buffer circuit 500 can be used to interface between the JFET circuitry and the higher voltage operating circuitry. As but two very particular examples, the circuit sections shown in FIG. 1 can be incorporated in the same semiconductor substrate. Similarly, the circuit sections of FIG. 6 can be incorporated in the same semiconductor substrate.

Further, circuit sections operating at higher voltages can include IGFET type devices, as opposed to all or predominantly JFET devices.

It is understood that reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of interfacing between a first semiconductor device including junction field effect transistors (JFETs) and a bus, comprising the steps of:
   receiving an input signal having a first voltage swing at an input terminal of the first semiconductor device including JFETs;
   translating the input signal to an internal signal having a second voltage swing lower than the first voltage swing;
   providing the input signal onto the bus from a second semiconductor device operating at a second power supply voltage higher than a first power supply voltage at which the first semiconductor device operates;
   receiving the internal signal by core circuitry including JFETs and operating at a first power supply voltage;
   providing a second internal signal having essentially the second voltage swing from the core circuitry; and
   translating the second internal signal to an output signal having essentially the first voltage swing.

2. The method of claim 1, wherein:
the first voltage swing is substantially greater than the second voltage swing.

3. The method of claim 1, wherein:
the first power supply voltage is essentially the same value as the second voltage swing.

4. The method of claim 1, wherein:
the second voltage swing is about 0.5 volts.

5. The method of claim 1, further including:
providing the input signal onto the bus from a second semiconductor device operating at a second power supply voltage higher than a first power supply voltage at which the first semiconductor device operates.

6. A system, comprising:
at least a first semiconductor device, comprising
   an input buffer including at least one junction field effect transistor (JFET), the input buffer receiving an input signal having a first voltage swing and providing a shifted signal having a second voltage swing lower than the first voltage swing; and
   core circuitry comprising JFETs, the core circuitry coupled to receive the shifted signal wherein the core circuitry operates from a first power supply having a magnitude less than the first voltage swing; and
   an output buffer including at least one JFET, the output buffer coupled to receive a first signal having essentially the second voltage swing from the core circuitry and providing an output signal having essentially the first voltage swing.

7. The semiconductor device of claim 6, wherein:
the first semiconductor device further includes a higher voltage section coupled to and formed in the same substrate as the output buffer, the higher voltage section operating at a power supply level greater than the first power supply.

8. The semiconductor device of claim 7, wherein:
the higher voltage section comprises insulated gate field effect transistors (IGFETs).

9. The system of claim 6, further including:
at least a second semiconductor device coupled to the output buffer of the first semiconductor device by at least one signal line, the second semiconductor device operating at a power supply level greater than the first power supply.

10. The system of claim 6, further including:
the first power supply has a magnitude of less than a forward bias voltage of a pn junction formed by at least one of the JFETs in the core circuitry and the core circuitry includes complementary JFETs.

11. The system of claim 6, further including:
at least a second semiconductor device coupled to the input buffer of the first semiconductor device by at least one signal line, the second semiconductor device operating at a power supply level greater than the first power supply.

12. The semiconductor device of claim 6, wherein:
the first semiconductor device further includes a higher voltage section formed in the same substrate as the input buffer circuit and coupled thereto, the higher voltage section operating at a power supply level greater than the first power supply.

13. The semiconductor device of claim 11, wherein:
the higher voltage section comprises insulated gate field effect transistors (IGFETs).

* * * * *